US012663440B2

(12) United States Patent
Mühlhausen

(10) Patent No.: US 12,663,440 B2
(45) Date of Patent: Jun. 23, 2026

(54) BUSBAR FOR MEASURING A DIRECT AND/OR ALTERNATING CURRENT

(71) Applicant: SMA Solar Technology AG, Niestetal (DE)

(72) Inventor: Felix Mühlhausen, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 163 days.

(21) Appl. No.: 18/534,854

(22) Filed: Dec. 11, 2023

(65) Prior Publication Data

US 2024/0110945 A1      Apr. 4, 2024

Related U.S. Application Data

(63) Continuation of application No. PCT/EP2022/067415, filed on Jun. 24, 2022.

(30) Foreign Application Priority Data

Jun. 24, 2021    (DE) ..................... 10 2021 116 419.2

(51) Int. Cl.
$$
\begin{array}{ll}
\textbf{G01R 1/20} & (2006.01) \\
\textbf{G01R 15/14} & (2006.01) \\
\textbf{G01R 19/00} & (2006.01) \\
\textbf{H02M 1/00} & (2007.01)
\end{array}
$$

(52) U.S. Cl.
CPC ........... G01R 1/203 (2013.01); G01R 15/146 (2013.01); G01R 19/0092 (2013.01); H02M 1/0009 (2021.05)

(58) Field of Classification Search
CPC .. G01R 1/203; G01R 15/146; G01R 19/0092; H02M 1/0009
See application file for complete search history.

(56) References Cited

U.S. PATENT DOCUMENTS

| | | | |
|---|---|---|---|
| 11,293,952 B2 | 4/2022 | Mueller et al. | |
| 11,415,601 B2 * | 8/2022 | Hung ................. | G01R 19/0092 |
| 2016/0041206 A1 * | 2/2016 | Hetzler ................ | G01R 35/005 |
| | | | 324/126 |
| 2020/0386794 A1 * | 12/2020 | Sugito .................. | G01R 15/205 |

(Continued)

FOREIGN PATENT DOCUMENTS

| | | |
|---|---|---|
| DE | 2939594 A1 | 4/1981 |
| DE | 102015216789 A1 | 3/2017 |

(Continued)

OTHER PUBLICATIONS

International Search Report dated Oct. 12, 2022 for International Application No. PCT/EP2022/067415.

*Primary Examiner* — Akm Zakaria
(74) *Attorney, Agent, or Firm* — Eschweiler & Potashnik, LLC

(57) ABSTRACT

A busbar for measuring a direct and/or alternating current has connection regions and at least one resistance region arranged between the connection regions, and two measuring contacts arranged in the resistance region. The busbar has a geometry in which the measuring contacts are currentless during operation of the busbar. The busbar is formed in one piece. An apparatus for determining current and having such a busbar and a power converter having such an apparatus are also disclosed.

17 Claims, 5 Drawing Sheets

(56)                 References Cited

U.S. PATENT DOCUMENTS

2023/0168281 A1*   6/2023   Kramm ................. G01R 1/203
                                                        324/126
2023/0266368 A1*   8/2023   Marien ................. G01R 1/203
                                                        324/126
2023/0273244 A1*   8/2023   Spitzer ................ G01R 15/207
                                                        324/117 H

FOREIGN PATENT DOCUMENTS

DE       102016217874  A1     3/2018
DE       202020101280  U1     3/2020
DE       102020111634  B3     4/2021
EP            3671225  A1 *   6/2020   .............. H01C 3/00
GB           2259783   A      3/1993

* cited by examiner

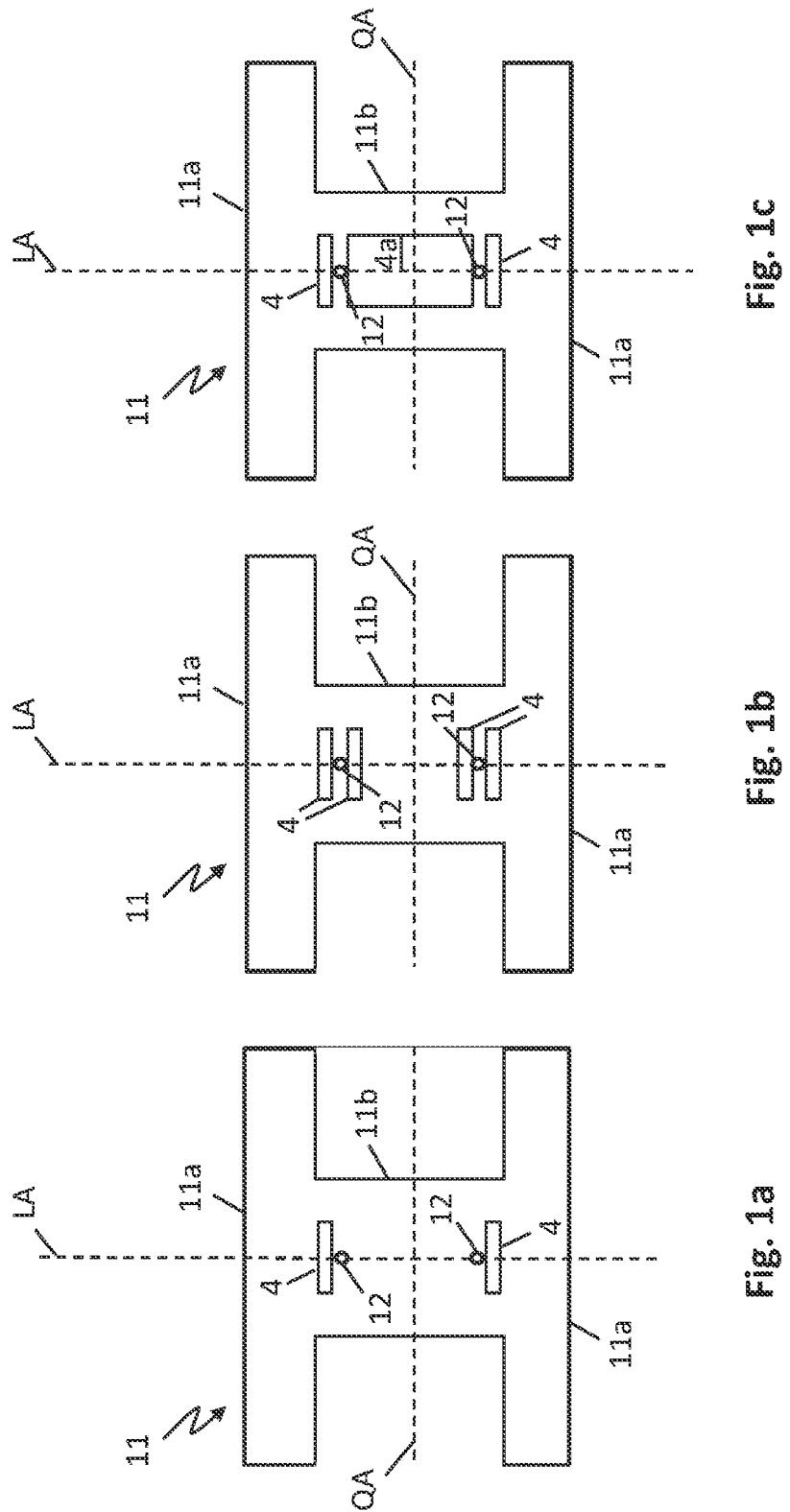

BUSBAR FOR MEASURING A DIRECT AND/OR ALTERNATING CURRENT

REFERENCE TO RELATED APPLICATIONS

This application is a Continuation of International Application number PCT/EP2022/067415, filed on Jun. 24, 2022, which claims the benefit of German Application number 10 2021 116 419.2, filed on Jun. 24, 2021. The contents of the above-referenced Patent Applications are hereby incorporated by reference in their entirety.

FIELD

The application relates to a busbar for measuring an electrical direct current and/or alternating current, for example, with current intensities greater than 100 amperes, an apparatus for current determination, and an electrical power converter having an apparatus for current determination.

BACKGROUND

A busbar is an apparatus made of electrically conductive material for conducting electrical currents between connection regions of the busbar.

For precise determination of electrical currents, especially of high currents in the range of a few hundred amperes to a few kiloamperes, low-resistance measuring resistors, so-called shunts, can be used. In shunts, measuring taps are usually contacted in the connection regions on both sides directly next to a resistance material. The resistance material of the shunt differs from the rest of the shunt material in particular by a (slightly) increased specific resistance and is characterized, for example, by a resistance value of the electrical resistance that is constant even over large temperature ranges.

For example, a measuring arrangement for measuring a current is known from DE 10 2016 010 012 B4, in which pairs of voltage taps as measuring contacts measure a voltage dropping across a resistance material, wherein from the dropping voltage and the resistance value of the resistance material a measuring circuit, using Ohm's law, determines a measure of the electric current flowing through the resistance material.

DE 10 2013 005 939 A1 describes the problem of a phase error in shunts in the high current range. The solution described therein for avoiding a phase error comprises a multiple voltage measurement at different positions on the shunt and weighted averaging with dynamic weighting factors.

DE 10 2020 111 634 B3 describes a shunt with dedicated resistance material and pairs of taps, one tap (on one side) being surrounded by an incision that prevents a flow of current across the incision.

A press-fit pin which is pressed into a press-fit hole in the shunt can be used as the voltage tap. Such a press-fit pin within a press-fit hole in a region of a shunt through which current flows acts as a voltage divider between the different potentials at the opposite ends of the press-fit hole. If, for example, due to mechanical effects, the transition resistances change at the different ends of the press-fit connection, this results in a change in the voltage divider. This changes the effective position of the press-fit pin and thus the effective distance between two measuring contacts, also called measuring points, over which the voltage drop is measured during shunt current measurement. A typical diameter of the press-fit holes is, e.g., 1 mm for metallic workpieces. In the case of a tapping length, i.e., a nominal distance between two measuring contacts of, for example, 20 mm, the effective distance between the effective positions of the voltage taps at the respective outer ends of the press-fit holes can be between 19 mm and 21 mm, i.e., measured values can differ by up to 10% with otherwise identical electrical boundary conditions.

In the case of shunt current measurements, shunts in the range of a few micro-ohms are used in order to keep the power loss within an acceptable range. To achieve such low measuring resistances, resistance alloys with high conductivities and large cross-sections must be used. At a nominal current in the range of a few hundred amperes, voltage drops to be measured therefrom can result that are in the range of a few millivolts.

In AC current measurements with shunt resistors having large dimensions, significant phase errors can, in addition, occur due to skin effects and induction. The phase errors that can occur during shunt current measurement are essentially caused by induction voltages within the measuring lines (depending on the routing of the measuring lines) and by the skin effect, which in the case of alternating current results in a position-dependent phase position of current density within the shunt. The skin effect causes not only a frequency- and position-dependent amplitude, but also a frequency- and position-dependent phase, the latter often being much more significant in the application. Induction voltages are induced in the measuring leads between the shunt and the evaluation unit when the measuring leads span with the shunt a surface through which the time-variant magnetic field of the load current passes. This effect occurs in high-current shunts in a distinctly measurable order of magnitude because, compared to usual shunt current measurements in the low ampere range, the magnetic fields grow linearly with the current and their influence increases linearly with the reduction of the measuring voltage. The combination of these two effects means that inductive influences also have a measurable effect at low frequencies within the range of the mains frequency and of its single-digit harmonics, which is mainly reflected in a frequency-dependent phase error. For example, for AC current measurements at the output of an inverter bridge, manganin shunts with soldered-on measurement circuit boards can be used that have a phase error of about 3 degrees at mains frequency and a phase error of about 12 degrees within the range of an actively controlled harmonic, e.g., at 250 Hz. However, when fast-switching power semiconductors are used, a phase-correct measurement of the alternating currents is necessary to control harmonics at high frequencies. Furthermore, when shunts made of resistive materials that have a significant temperature coefficient of the specific resistance are used, the frequency-dependent phase error will also depend on temperature, so that a digital frequency response compensation would be costly.

SUMMARY

The present disclosure is directed to a busbar for measuring current which makes possible the best possible measurement with the simplest possible and/or most cost-effective design.

A busbar for measuring a direct and/or alternating current, for example, with current intensities greater than one hundred amperes, has connection regions and at least one resistance region arranged between the connection regions. Two measuring contacts are arranged in the resistance region. The busbar is formed in one piece and has a geometry in which the regions of the measuring contacts are essentially currentless during operation of the busbar.

In one embodiment, the busbar has two connection regions and also a resistance region situated between the connection regions and having an essentially flat surface. The resistance region thus establishes an electrical and a mechanical connection between the connection regions.

In such a one-piece busbar for measuring current, which is, in one embodiment, made of a single material such as copper or aluminum, the geometry of the busbar and, for example, the geometry of the resistance region is selected such that the regions of the measuring contacts are currentless, while the predominant part of the resistance region carries the working current and during operation, for example in a power converter, several hundred amperes or even several kiloamperes flow through it. This working current flowing through the busbar can be determined by measuring the voltage or the voltage difference between the two measuring contacts using the resistance value of the resistance region between the two measuring contacts. The largely currentless regions of the measuring contacts here make possible a more precise measurement, because the measurement is more tolerant with respect to any shifts of the specific position of a measuring contact. In addition, a high homogeneity of the current density in the current-carrying region of the resistance region can be achieved.

Due to the one-piece design of the busbar, a simpler and more cost-effective structure can be achieved and, for example, manufacturing of the busbar with integrated resistance region and currentless measuring contact regions can be simplified. In addition, problems at the transitions between different materials could be avoided.

The busbar for measuring current can, for example, have a so-called current-shadow geometry. This is based on the idea of not placing the measuring taps in the current-carrying region of a busbar, but in a part of the busbar that is specifically made for this purpose and is designed such that the current ultimately to be measured does not flow through it, or does so only very weakly. Different geometries are conceivable for this purpose.

In one embodiment of the busbar, the resistance region is formed essentially by a taper of the cross-section relative to the cross-section of the connection regions of the busbar, the measuring contacts being located within the cross-sectional taper. The taper is formed here by a reduction in the width of the resistance region to a value between 10 and 60 percent of the width of the connection regions of the busbar. A higher current density can thereby be achieved in the resistance region than in the connection regions of the busbar, which in turn causes a higher voltage drop for a given current flowing through the busbar. Any associated higher losses in the resistance range are accepted here in support of raising the voltage drop into a range that can be readily measured.

Such a locally increased current density can be accompanied by an increased temperature in the resistance region. Optionally, however, this effect can be neutralized by a temperature compensation on the basis of the temperature measurement representative of the resistance region and overcompensated by a restriction to a locally limited and well-defined measurement range.

In the one-piece busbar for measuring current with cross-sectional taper as resistance region, the measuring contacts are located in the resistance region within the cross-sectional taper. Here the resistance value of the resistance region is temperature-dependent. A temperature sensor arranged on the resistance element therefore has the advantage that the measured temperature can be used to determine a calibrated resistance value of the resistance region, which is subsequently offset against the measured voltage drop between the measuring contacts in order to determine the current.

In one embodiment, if the resistive element is made of a common material that has very good conductivity, such as copper, but whose specific resistance is markedly temperature-dependent, it is advantageous to measure the temperature of the resistance material exactly at the location where the relevant voltage drop occurs. The arrangement of the temperature sensor between the measuring contacts offers this advantage.

In one embodiment, the busbar has a longitudinal center axis which runs through the resistance region in the longitudinal direction of the busbar from one of the connection regions to the oppositely situated connection region, wherein the measuring contacts are arranged in the region of the longitudinal center axis and wherein the busbar is essentially symmetrical with respect to the longitudinal center axis, at least between the respective connection regions. The busbar for measuring current thus has a current-shadow geometry with measuring taps lying centrally on a longitudinal center axis lying along the flow direction of the current. These have a great robustness against mechanical influences and external magnetic fields and can therefore provide well-reproducible results.

In one embodiment, the busbar is configured to be essentially symmetrical with respect to a transverse center axis at least between the respective connection regions, wherein the transverse center axis runs centrally between the connection regions in the transverse direction of the busbar, and wherein the measuring contacts are arranged essentially symmetrically relative to the transverse center axis.

In one embodiment, the geometry of the busbar has at least two recesses in the resistance region, which recesses are arranged in the region of the measuring contacts and are spaced apart from the measuring contacts in the longitudinal direction, wherein a recess is arranged in the region of each measuring contact. The recesses are arranged in such a way that the region of the measuring contacts is largely currentless in that the recesses are arranged in particular in front of or behind the measuring contacts when viewed in the direction of current flow. The region of the resistance region outside the regions of the measuring contacts can here be referred to as a current-carrying or current flow-through region.

In one embodiment of the busbar, at least one temperature sensor is arranged between the measuring contacts, for example, in the region of the longitudinal center axis and/or of the transverse center axis. An individual temperature sensor, in one embodiment, can be arranged on the longitudinal center axis and on the transverse center axis. Alternatively, for example, two temperature sensors can be arranged on the transverse center axis and essentially symmetrically about the longitudinal center axis. The measuring contacts can be arranged essentially symmetrically with respect to the transverse center axis, or around the temperature sensor(s).

In one embodiment of the busbar, at least one recess is arranged between the measuring contacts, wherein the recess is arranged between the measuring contacts and is configured to be essentially symmetrical and has the longitudinal center axis and/or the transverse center axis as an axis of symmetry.

In one embodiment of the busbar, the longitudinal center axis forms an axis of symmetry of one or more recesses.

Alternatively or additionally, at least two recesses can be arranged essentially symmetrically with respect to the transverse center axis.

In one embodiment of the busbar, a respective recess is arranged on two sides of each measuring contact in the direction of current flow, the recesses being formed along the longitudinal center axis and/or along the transverse center axis essentially symmetrically with respect to the respective measuring contact. In one embodiment, the recesses can be essentially point-symmetrical in relation to the measuring contact and/or essentially axially symmetrical in relation to an axis running through the measuring contact. The recesses can be essentially axially symmetrical in relation to the longitudinal center axis running through the respective measuring contact.

In one embodiment of the busbar, the respective regions of the measuring contacts each have a measuring point plateau and respective connecting crosspieces, the measuring contacts being arranged on the respective measuring point plateau. The respective measuring point plateau is connected to the current-carrying region of the resistance region via the respective connecting crosspieces, the connecting crosspieces preferably running transversely to the longitudinal center axis. The connecting crosspieces are, for example, bounded by the recesses. Via the connecting crosspieces, the measuring point plateau is at a potential which corresponds to the potential at the interfaces of the connecting crosspieces with the current-carrying region of the resistance region, so that the voltage difference between the measuring contacts essentially corresponds to the voltage difference between these interfaces. At the same time, the geometry with measuring point plateau and connecting crosspieces is designed such that the working current, which flows parallel to the longitudinal center axis through the current-carrying regions, does not flow via the connecting crosspieces oriented parallel to the transverse center axis and the measuring point plateau. The measuring point plateau and the connecting crosspieces, and thus the region of the measuring contacts, are thereby largely currentless.

In one embodiment of the busbar, the connecting crosspieces have a width between two and five millimeters and the measuring point plateaus have a longitudinal extension between five and twelve millimeters. The width of the connecting crosspieces here refers to their extension perpendicular to the direction in which they connect their respective measuring point plateau to the current-carrying region of the resistance region. In one embodiment, the connecting crosspieces run parallel to the transverse center axis and symmetrically on opposite sides of the respective measuring point plateau, and connect the measuring point plateau to the current-carrying region of the busbar. The longitudinal extension of the measuring point plateau refers to its extension in the direction of the connecting crosspieces and/or in a direction perpendicular to the direction of the connecting crosspieces.

In one embodiment of the busbar, recesses are arranged on both sides of the measuring point plateaus and the connecting crosspieces, which are intersected centrally by the longitudinal center axis and in each case have a width of between two and ten mm in the direction of the longitudinal center axis.

In one embodiment of the busbar, the material thickness of the resistance region and/or of the connection regions is between two and six millimeters. The material thickness corresponds here to a thickness of the busbar in the resistance region and in the connection regions. The cross-section of the resistance region can here be regarded as a surface which has the width of the resistance region and the thickness of the busbar as side lengths.

The busbar can be configured for conducting currents whose current intensity is more than 100 amperes, or more than 1000 amperes. Here the busbar is formed in one piece, for example, from a material such as copper or aluminum, the resistance region being formed essentially by a taper of the cross-section relative to the cross-section of the connection regions of the busbar. Material transitions are thereby avoided and the production and assembly outlay is reduced. In particular when busbars made of copper are used, a considerable cost saving can be achieved, since shunts with a resistance region made of special resistance material, e.g. manganin, can be significantly more expensive. Alternatively or additionally, the recesses can be punched out. Production and assembly outlay can thereby be further reduced.

In one embodiment of the busbar, the measuring contacts are configured as press-fit pins which are pressed into press-fit holes in the busbar. Measurement deviations due, for example, to installation tolerances or aging can be minimized in this way. In addition, assembly can be realized more cost-effectively. The measuring contacts can optionally also be configured as spring contacts, as soldered connections or as screw connections with the busbar. In this way the contacting of measuring contacts on the busbar, which is configured for high currents, can be technically simplified. In one example, inaccuracies in the positioning of the measuring contacts, which can lead to measurement errors, can be avoided.

The transition resistances between a press-fit pin and the busbar can be influenced by mechanical effects. It is therefore advantageous in one embodiment to arrange the press-fit contacts in a largely currentless region of the busbar, so that a voltage drop along the press-fit pin and along the finite width of the press-fit holes is minimized. As a result, a potential difference or voltage drop between opposite ends of a press-fit hole in the busbar can be minimized to the extent that it is no longer relevant as regards measurement technology whether the press-fit contact comes into contact sometimes with the one and sometimes with the other end of the press-fit hole, depending on the mechanical load. The long-term stability of the measurement can thereby also be significantly improved. Measurement deviations can be minimized in this way, even if the measuring contact mechanically shifts a little or the electrical properties change.

An apparatus for determining current has a busbar and a printed circuit board arranged plane-parallel to the busbar for measured value acquisition. In one embodiment, the printed circuit board lies on the busbar in a plane-parallel manner. The measured value acquisition can comprise an acquisition of a voltage difference between two measuring contacts of a resistance region and optionally a temperature detection via the temperature sensor of the relevant resistance region. Here the measuring contacts can be connected via measuring lines to a common tapping point at which, for example, a voltage sensor is arranged which detects the voltage between the end points of the measuring lines at the common tapping point. Here the measuring lines can run in a plane of the printed circuit board which is arranged as the outermost inner layer of the printed circuit board on the side of the printed circuit board facing the resistance region, and/or run completely or partially in other planes or layers of the printed circuit board.

It is thereby possible to arrange the connections between the measuring contacts and the evaluation unit very close to the resistance region, in particular in order to prevent conductor loops. Conductor loops, especially in the vicinity of high currents, can lead to considerable impairments or distortions of measurement due to electromagnetic effects, especially if the currents contain periodic or transient components.

In one embodiment, the circuit board can comprise the temperature sensor and can be arranged in the resistance region on the surface of the busbar in such a way that the temperature sensor is arranged in thermal connection with the resistance region of the busbar. Here the measuring contacts that make electrical contact with the surface of the busbar are arranged for example on both sides of the temperature sensor and are connected to the measuring lines in order to detect a voltage difference along the resistance region by using a suitable voltmeter on the printed circuit board.

In one embodiment of the apparatus, the printed circuit board lies flat on the busbar, so that the measuring contacts establish electrical contact between the surface of the busbar and the measuring lines in the printed circuit board by the shortest path and the temperature sensor lies on the surface of the shunt. In this way, a current measurement with a high accuracy can be achieved.

In one embodiment of the apparatus, measured value acquisition takes place via measuring lines that are installed as conductor paths within the printed circuit board in such a way that frequency-dependent phase and amplitude measurement errors are reduced. The measuring lines for connecting the measuring contacts to an evaluation unit, for example, a voltmeter, can be installed as conductor paths within a printed circuit board along a path relative to the surface of the busbar in such a way that the phase and amplitude error is greatly reduced compared to a conventional installation of the measuring lines, for example, compared to a direct straight-line connection between the measurement points and the common tapping point. The installation of the measuring lines as conductor paths can take place, for example, on the basis of theoretical preliminary considerations and/or with the aid of a numerical simulation.

In one embodiment of the apparatus, the measuring lines originate from the measuring contacts and are brought together at a common tapping point. For this purpose, starting from at least one of the measuring contacts, which is arranged on or near the longitudinal center axis of the busbar, the measuring lines are routed away from the measuring contact in two directions and first run outwards to the edge of the resistance region and then back to the other measuring contact, which is likewise arranged on or near the longitudinal center axis of the busbar. Here the measuring lines can already reach their reversal point in each case before the edge, can reach the edge, or can even go past the edge. The course of the measuring lines in the direction of the edge and back can be at least in part essentially symmetrical to the longitudinal center axis and/or to the transverse center axis of the resistance region.

One feature of installation can be, for example, a course which initially runs in a straight line transversely to the direction of current flow along the connecting crosspieces into the resistance region and continues obliquely to the longitudinal and transverse center axes and outward to the edge region of the resistance region and obliquely back inward to the other measuring contact, this course overall being essentially symmetrical with respect to the longitudinal center axis and/or to the transverse center axis.

In one embodiment of the apparatus, the measuring lines span an essentially closed measuring line region that includes between 70 and 100 percent of the width of the resistance region in one dimension and between 70 and 100 percent of the distance between the measuring contacts in the dimension perpendicular thereto, the measuring lines running along the connecting crosspieces and outside an overlap region with the recesses. The measuring lines thus do not run over the recesses in one embodiment.

In one embodiment of the apparatus, the measuring lines spanning the measuring line region can consist of a plurality of conductor paths running parallel to one another, wherein the individual conductor paths can be arranged in the same or different planes of the printed circuit board.

In one embodiment, the measuring lines can span a polygon, e.g. a hexagon, wherein the polygon can have axes of symmetry which run along the transverse center axis and/or the longitudinal center axis. The width of the polygon can be approximately 70-100% of the width of the resistance region.

The special installation of the measuring lines enables a significant reduction in the frequency- and temperature-dependent phase and amplitude errors in AC current measurement with busbars for measuring current in the microohm range. In addition, a very wide measuring range between milliamperes and kiloamperes is realized, which can exhibit a largely linear frequency response in the range of the mains frequency and, beyond that, in the range of the harmonics of the mains frequency that are relevant for control purposes.

In conventional AC current measurement with busbars for measuring current which have large dimensions, significant phase errors can occur due to skin effects and induction. The phase errors which can occur during current measurement are largely avoided by the above-described installation of the measuring lines. Here the skin effect not only causes a frequency- and position-dependent amplitude, but also a frequency- and position-dependent phase, the latter often being much more significant in the application. Induction voltages are created in the measuring lines between the busbar and the evaluation unit when the measuring lines with the busbar span a surface through which the time-variant magnetic field of the current to be measured passes. The arrangement described above avoids spanning such a surface with the busbar. Instead, due to the fact that the measuring lines span a closed measurement line region oriented parallel to the busbar, the susceptibility to interference with respect to external magnetic alternating fields is greatly reduced, because voltages induced in the measuring lines cause a current flow within the practically closed measuring line, which in turn compensates the induced voltages by its ohmic voltage drop. The apparatus for measuring current is thus well suited for use with fast-switching power semiconductors, for example in a power converter, where a phase-correct measurement of the alternating currents for regulating harmonics at high frequencies is advantageous.

In one embodiment of the apparatus, the circuit board comprises further conductor paths which are configured as a configurable compensation structure for further compensation of the above-mentioned effects and are arranged in the resistance region. The conductor paths of the compensation structure are electrically connected in series with one of the measuring lines and in this respect extend the measuring line. In particular, the compensation structure can be electrically arranged between the measuring line that spans the measuring line area and the tapping point, or it can be connected to an interruption in a measuring line. Due to the series connection of a measuring line and the compensation structure, the voltages induced in the conductor paths of the compensation structure overlap with the voltages induced in the measuring lines.

The compensation structure comprises, for example, compensation paths which comprise conductor paths which span a surface which is aligned perpendicular to the surface of the busbar and parallel to the current flow direction. The compensation paths comprise conductor paths which are arranged in different planes or layers of the printed circuit board and run essentially parallel to one another, and through-contact holes, so-called vias, that connect the conductor paths to one another in different planes.

A compensation path can include two compensation arms which are oriented in opposite directions. Here a compensation arm, for example, starting from a connection point, can comprise a first conductor path in a first layer of the printed circuit board, a via from the first layer to a second layer, a second conductor path in the second layer of the printed circuit board, which runs parallel to the first conductor path back to the connection point, and a further via from the second to the first layer of the printed circuit board. The other compensation arm of a compensation path can be configured to be mirror-inverted relative to the first compensation arm, i.e. extend in the opposite direction of the first compensation arm and also parallel to the longitudinal axis of the resistance region. By means of an electrical connector, for example, a wire bridge, which connects one or the other of the compensation arms to the measuring line, it can then be selected which compensation arm will be added to the measuring line, and compensation with different signs can be realized by the mirror-image structure of the compensation arms. Alternatively, the entire compensation path can be bridged with a wire bridge.

In one embodiment of the apparatus, a plurality of compensation paths can be arranged spatially parallel to one another and electrically connectable in series. Here the compensation paths have different lengths and thus span surfaces of different sizes which result in different compensation contributions. By means of further electrical connectors, it can then be selected which compensation arms of which compensation paths will be connected to the measurement line, individual compensation paths being bridgeable by suitable connectors and to that extent inactive. This results in various possible combinations with different accumulated spanned surfaces, yielding compensation contributions from zero (no compensation arm connected) to several intermediate values (one or more compensation arms connected with the same or opposite orientation) up to a maximum value (all compensation paths connected with the same orientation).

It will be understood that the apparatus for determining current has a busbar and a printed circuit board for measured value acquisition, wherein the printed circuit board with the features described above can be arranged on busbars, which basically has a resistance region and voltage taps. In one example, here the printed circuit board with the compensation structure is largely independent of the specific shape of the busbar or the specific realization of the resistance region in the busbar.

In a power converter with current-carrying lines for conducting the direct and/or alternating currents processed by the power converter, at least one of the current-carrying lines has an apparatus for determining current, which apparatus bridges an interruption of the at least one current-carrying line or is integrated into the at least one current-carrying line. The power converter is set up to determine a current flowing through the current-carrying lines during operation of the power converter by using a voltage difference along the resistance region of the busbar detected by means of the measuring contacts, the power converter being designed for a nominal power which is greater than 10 kW, greater than 100 kW, or greater than 1000 kW.

The high measurement accuracy achievable by the busbar according to the present application makes it possible to reduce the hardware reserves to be kept in the power converter and/or to achieve a higher nominal power with other hardware present of the power converter.

In one embodiment, the power converter has a multi-channel apparatus for determining current, the multi-channel apparatus having a multi-channel busbar, the multi-channel busbar having on a first side at least two individual connection regions for connecting a plurality of current-conducting lines and having on a second side a common busbar as a common connection region. Here the individual connection regions are each assigned a resistance region which is arranged between the respective individual connection region and the busbar.

Here the multi-channel busbar has a parallel circuit of identical or differently dimensioned resistance regions in which basically different currents flow, which currents are measured via the respective voltage drop between the measuring contacts of the respective resistance regions. The resistance regions here each have an optimized current-shadow geometry as described above. The multi-channel busbar has on one side first connection regions which are electrically separated from one another and respective resistance regions, which are electrically and mechanically connected to one another on the other side of the multi-channel busbar, so that a common second connection region forms. Such a multi-channel busbar can be used, for example, in a DC input section of a central inverter of a PV system (photovoltaic system) on the one hand to measure the PV input currents of several strings of photovoltaic modules individually and on the other hand to supply them to a PV busbar as a combined total PV current.

With a multi-channel busbar, reduced material costs can be realized in comparison with several single-channel busbars. A simpler production and assembly, and a reduced logistics effort, can result.

In one embodiment of the power converter, a printed circuit board for measured value acquisition is arranged plane-parallel to the busbar and lies plane-parallel on the busbar, wherein the printed circuit board covers a plurality of resistance regions and is connected to the measuring contacts of a plurality of resistance regions. Various components can be dispensed with by using a common printed circuit board for multi-channel busbars, since they only have to be realized singly instead of multiply, e.g. power supplies, microprocessors, analog-to-digital converters, communication drivers, wiring, and the like.

In one embodiment of the power converter, the circuit board has an evaluation circuit for preprocessing the measured voltages and optionally the temperatures of the individual resistance regions, and also a galvanic isolation, the evaluation circuit being connected to a control unit of the power converter via the galvanic isolation. The use of a common printed circuit board for the measuring electronics with galvanic isolation from a communication means or the surrounding electronics offers the advantage that the galvanic isolation has to be provided only once for a plurality of measurement channels. This makes cost advantages possible. This is advantageous if a galvanic isolation of the measuring electronics from the surroundings is necessary, for example in the case of high DC voltages at the DC inputs of a PV inverter. Here, this isolation can be set up just once instead of separately for each single-channel busbar.

In a further embodiment, the printed circuit board of the multi-channel busbar has slots which are arranged between the resistance regions and extend parallel to the longitudinal center axis from one edge of the printed circuit board over at least half of the length of the printed circuit board. In addition, these slots can be arranged next to one another in pairs starting from the opposite edges. They divide the printed circuit board into individual subregions which are movable relative to one another and which are individually assigned to the respective resistance regions. As a result, the printed circuit board can follow any deformations of the individual resistance regions or connection regions of the multi-channel busbar relative to one another, thus preventing not only a twisting of the printed circuit board but also a partial lifting of the printed circuit board from the surface of the busbar in the event of such deformations.

A power converter has current-carrying lines for conducting the direct and/or alternating currents processed by the power converter. At least one of the current-carrying lines comprises an apparatus for determining current according to the preceding description, wherein the apparatus bridges an interruption of the current-carrying lines or is integrated into the current-carrying lines. The power converter is set up to determine a current flowing through the current-carrying lines during operation of the power converter from a voltage difference along the resistance region detected by means of the measuring contacts and a resistance value of the resistance region. Here the resistance value used for the corresponding calculation of the current intensity can be a function of the temperature detected by the temperature sensor.

In one embodiment, the power converter is configured for a nominal power that is greater than 10 kW, greater than 100 kW, or greater than 1000 kW. In these power classes, a determination of the direct and/or alternating currents processed by the power converter is demanding due to their correspondingly high amplitudes and can be carried out precisely with the described apparatus for current determination, the described apparatus for determining current being capable of being integrated easily into the structure of the power converter.

BRIEF DESCRIPTION OF THE FIGURES

In the following, the subject-matter of the application is further explained and described with reference to embodiments shown in the figures.

FIGS. 1a, 1b, 1c schematically show embodiments of busbars for measuring current;

In the figures, identical or similar elements are denoted by the same reference signs.

DETAILED DESCRIPTION

Figures 2A, 2B:
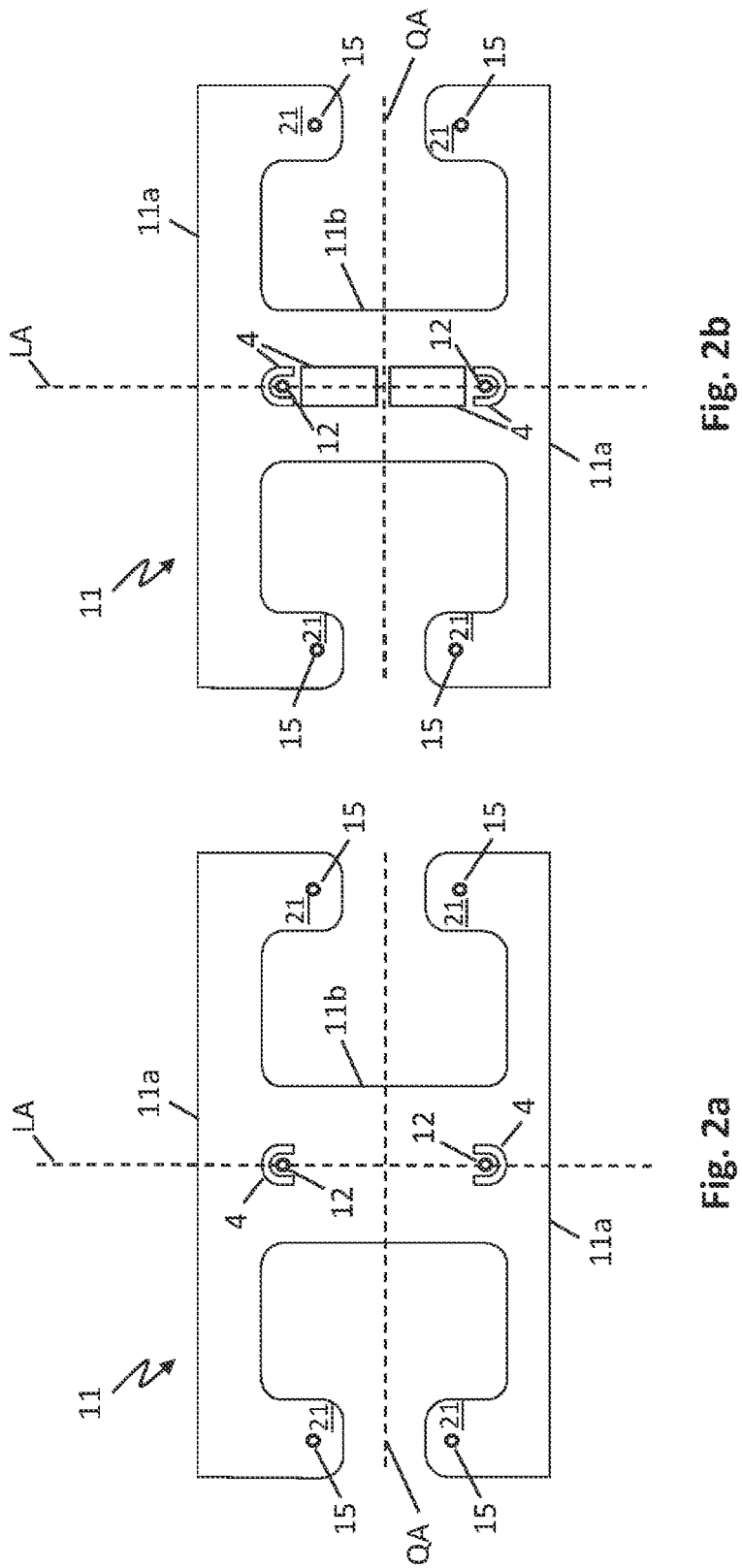
FIGS. 2a, 2b schematically show further embodiments of busbars for measuring current.

FIGS. 1a to 1c schematically show busbars 11 for measuring current according to the application.

The busbar 11 shown in FIG. 1a has two mutually opposite connection regions 11a and a resistance region 11b arranged between the connection regions 11a, in which the cross-section of the busbar 11 in the resistance region is smaller compared to the cross-section of the connection regions 11a. The reduction in the cross-section is effected in the shown busbar 11 by a reduction in the width of the busbar 11 in its resistance region 11b; alternatively or additionally, the thickness of the busbar 11 in the resistance region 11b can be reduced relative to the connection regions 11a. The busbar is formed in one piece and is, for example, made of one material, e.g. copper or aluminum. By connecting a current-carrying conductor (not shown) to the one connection region 11a and continuing the conductor at the other connection region 11a, the busbar 11 bridges an interruption of the conductor. When an electrical current flows through the conductor, the same electrical current then flows through the busbar 11, namely from the one connection region 11a via the resistance region 11b to the other connection region 11a.

The busbar 11 shown is structured essentially symmetrically in relation to a longitudinal center axis LA and a transverse center axis QA. Two measuring contacts 12 are arranged in the region of the longitudinal center axis LA. The two measuring contacts 12 are essentially symmetrically arranged in relation to the transverse center axis QA. A voltage or potential difference between the measuring contacts 12 can be detected via the measuring contacts 12. By using the electrical resistance of the material of the resistance region 11b connecting the two measuring contacts 12, the value of the current flowing through the busbar 11 can be determined from this voltage difference.

The measuring contacts 12 are, in one embodiment, configured as press-fit pins, which offers advantages in manufacturing, for example, with regard to accuracy. The above description also applies in an analogous manner to the busbars 11 shown in FIGS. 1b and 1c.

The busbar 11 shown in FIG. 1a has recesses 4 which are adjacent to each of the measuring contacts 12 and are each spaced slightly apart from the measuring contacts 12 in the direction of the longitudinal center axis LA. The recesses 4 are arranged such that they create a so-called current shadow at the measuring contacts 12; this means that the current flows essentially around the recesses 4 and the measuring contacts 12 are thus largely currentless due to their arrangement in the immediate vicinity of the recesses 4. This can increase the measuring accuracy of the voltage dropping between the measuring contacts 12. The recesses 4 are here arranged transversely, for example, perpendicular to the longitudinal center axis LA. They are also essentially symmetrical in relation to the longitudinal center axis LA, and essentially symmetrically relative to one another in relation to the transverse center axis QA, so that the measuring contacts 12 are arranged between the recesses 4. In an alternative embodiment (not shown), the measuring contacts 12 can also be arranged on the other side of the respective recess 4, so that the recesses 4 are arranged between the measuring contacts 12.

The busbar 11 shown in FIG. 1b has two recesses 4 adjacent to each of the measuring contacts 12, which recesses are arranged on the opposite sides of the measuring points 12 as seen in the direction of the longitudinal center axis LA and extend essentially transversely, for example, perpendicular to the longitudinal center axis LA. The recesses 4 are arranged in such a way that they create a so-called current shadow at the measuring contacts. This means that the current flows essentially around the recesses

4 arranged in pairs and does not reach the measuring contacts 12. Due to the arrangement of the recesses 4, the regions of the measuring contacts 12 are therefore largely currentless. As compared to the busbar 11 in FIG. 1a, this effect of the current shadow is additionally improved by the pairwise arrangement of the recesses 4 per measuring contact 12, and the measurement accuracy can be further improved. The recesses 4 can here be formed essentially symmetrically in relation to the longitudinal center axis LA. The two recesses 4 in the region of a measuring contact 12 are also essentially symmetrically, for example, essentially point-symmetrically formed relative to the measuring contact 12. At the same time, the two recesses 4, which are arranged in the region of a measuring contact 12, can be essentially axially symmetrical relative to one another in relation to an axis which runs through the measuring contact 12. The recesses 4 of a measuring contact 12 can also be arranged, in relation to the transverse center axis QA, essentially symmetrically to the recesses 4 of the other measuring contact 12.

The busbar 11 shown in FIG. 1c has a recess 4 adjacent to each of the measuring contacts 12. The recesses 4 are here arranged transversely, for example, perpendicular to the longitudinal center axis LA. They are also formed essentially symmetrically in relation to the longitudinal center axis LA. The two recesses 4 are also arranged essentially symmetrically relative to one another in relation to the transverse center axis QA. In addition, the busbar 11 has a further recess 4a between the two measuring contacts 12. The further recess 4a is here arranged in the region of the longitudinal center axis LA and/or of the transverse center axis QA. The further recess 4a can, for example, be formed essentially symmetrically in relation to the longitudinal center axis LA and/or to the transverse center axis QA, and be directly adjacent to both measuring contacts 12.

The recesses 4 and 4a are arranged in such a way that they create a so-called current shadow at the measuring contacts 12; this means that the current flows essentially around the recesses 4 and 4a arranged along the longitudinal center axis LA and is essentially conducted in the current-carrying areas to the side of the recesses 4, 4a, so that the measuring contacts 12 are largely currentless due to the arrangement of the recesses 4 and 4a. The further recess 4a causes an even lower current density in the region of the measuring contacts 12 and an even more homogeneous current density in the current-carrying region of the resistance region 11b. This can further increase the measurement accuracy.

FIGS. 2a and 2b schematically show busbars 11 for measuring current according to another embodiment of the present disclosure.

The busbar 11 shown in FIG. 2a has two connection regions 11a which lie opposite one another and the resistance region 11b arranged between the connection regions 11a, in which the cross-section of the busbar 11 is smaller in comparison with the connection regions 11a. The reduction in the cross-section is effected in the illustrated busbar 11 by a reduction in the width of the busbar 11 in its resistance region 11b, but can also be effected by reducing the thickness of the busbar 11 in the resistance region 11b. The busbar is formed in one piece and is, for example, made of one material, e.g. copper or aluminum. When the busbar 11 bridges an interruption of a current-carrying conductor (not shown), an electric current will flow through the busbar 11 from the one connection region 11a via the resistance region 11b to the other connection region 11a.

The busbar 11 shown is structured essentially symmetrically in relation to a longitudinal center axis LA and a transverse center axis QA. Two measuring contacts 12 are arranged in the region of the longitudinal center axis LA. The two measuring contacts 12 are essentially symmetrically arranged in relation to the transverse center axis QA. A voltage or potential difference between the measuring contacts 12 can be detected via the measuring contacts 12. By using the electrical resistance of the material of the resistance region 11b connecting the two measuring contacts 12, the value of the current flowing through the busbar 11 can be determined from this voltage difference. The measuring contacts 12 are, in one embodiment, configured as press-fit pins, which offers advantages in manufacturing, for example, with regard to accuracy.

The connection regions 11a of the embodiments according to FIGS. 2a and 2b have edge-side extensions in the direction of the busbar center, which extend as projections 21 or lugs into the taper. The projections 21, which extend toward each other from opposite connection regions 11a, are separated from each other by a gap at the edge of the busbar 11, so that the electrical current flows exclusively through the resistance region 11b. Fastenings, e.g. in the form of pins 15, for example, press-fit pins, can be provided in the projections 21, which allow the busbar 11 to be fastened to other components and/or, for example, to a printed circuit board 2, 20 (cf. FIGS. 3b-4) on the busbar 11 and to make electrical contact if necessary. The pins 15 are, in one embodiment, of the same design as the measuring contacts 12. This can further simplify production. The above description also applies in an analogous manner to the busbar 11 shown in FIG. 2b.

The busbar 11 shown in FIG. 2a has a recess 4 around each of the two measuring contacts 12, which recess surrounds the respective measuring contact 12 on three sides, the "open" sides, for example, facing each other. The recesses 4 are arranged so that the current flows essentially around the recesses 4 and does not reach the measuring contacts 12, so that the regions of the measuring contacts 12 are largely currentless. The recesses 4 can at least partially have a curvature of a circular segment or be composed of three or more straight segments. The two recesses 4 can, for example, be arranged essentially symmetrically relative to one another in relation to the transverse center axis QA. Each of the recesses 4 can itself be formed essentially symmetrically in relation to the longitudinal center axis LA. The above description also applies in an analogous manner to the busbar 11 shown in FIG. 2b.

The busbar shown in FIG. 2b also has two further recesses 4, which are arranged in the region of the longitudinal center axis LA in such a way that they are intersected by said axis centrally in the longitudinal direction and extend from the respective measuring contact 12 up to just before the transverse center axis QA. In addition, the two further recesses 4 are arranged essentially symmetrically relative to one another in relation to the transverse center axis QA, so that only a narrow crosspiece remains in the region of the transverse center axis QA, on which a further measurement point, for example, a temperature sensor, can, for example, be arranged. The current flows essentially around the recesses 4 arranged along the longitudinal central axis LA and is carried essentially in the current-carrying regions lateral to the recesses 4. This further improves the current shadow for the measuring contacts 12 and further improves the homogeneity of the current density in the current-carrying areas of the resistance region 11b that remain lateral to the recesses 4.

Figures 3A, 3B:
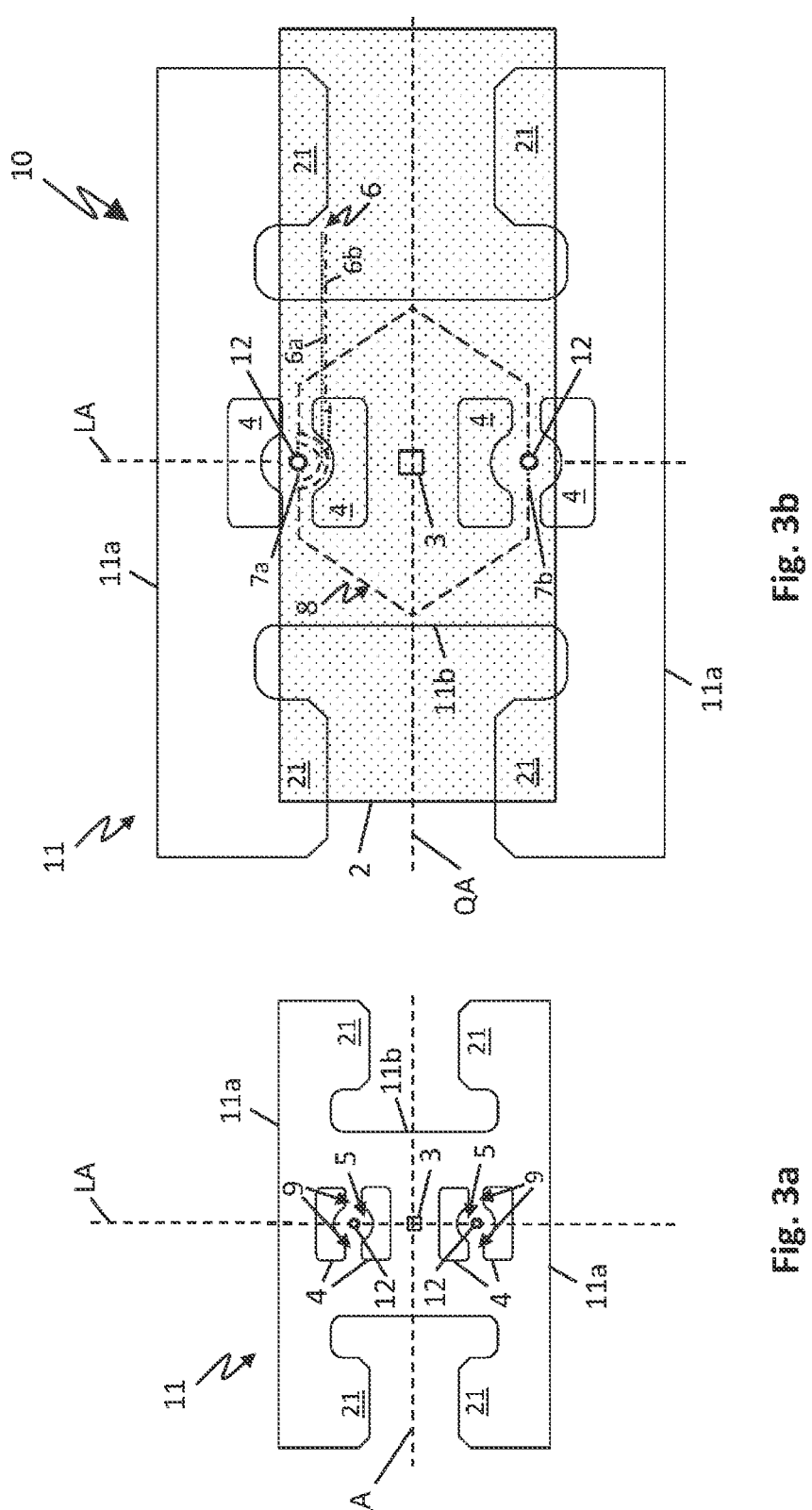
FIG. 3a schematically shows a further embodiment of a busbar for measuring current.
FIG. 3b schematically shows an embodiment of an apparatus for measuring current.

FIG. 3a schematically shows an embodiment of a busbar 11 for measuring current according to another embodiment of the present disclosure. The busbar 11 has four recesses 4, each of which encloses the measuring contacts 12 in a semi-circular shape. A temperature sensor 3 is arranged between the two recesses 4 that are central relative to the longitudinal center axis LA.

The busbar 11 according to FIG. 3a has, analogously to the previously described busbars 11 in FIGS. 1a, 1b, 1c, 2a, 2b, two mutually opposite connection regions 11a and the resistance region 11b arranged between the connection regions 11a, in which the cross-section of the busbar 11 is smaller in comparison with the connection regions 11a. In the illustrated busbar 11, the reduction in cross-section is achieved by a reduction of the width of the busbar 11 in its resistance region 11b and can alternatively or additionally include a reduction in the thickness. The busbar is formed in one piece and is, in one embodiment, made of one material, e.g. copper or aluminum. An electrical current flows through the busbar 11 when it bridges an interruption of a current-carrying conductor (not shown) connected to the connection regions 11a, wherein the current is conducted from the one connection region 11a via the resistance region 11b to the other connection region 11a.

The busbar 11 is essentially symmetrical in relation to the longitudinal center axis LA which runs through the resistance region 11b in the longitudinal direction of the busbar 11 from one of the connection regions 11a to the opposite connection region 11a. The measuring contacts 12 are, for example, arranged in the region of the longitudinal center axis LA. The busbar 11 shown can also be structured essentially symmetrically in relation to the transverse center axis QA. The two measuring contacts 12 can be arranged essentially symmetrically in relation to the transverse center axis QA. A voltage or potential difference between the measuring contacts 12 can be detected via the measuring contacts 12. By using the electrical resistance of the material of the resistance region 11b connecting the two measuring contacts 12, the value of the current flowing through the busbar 11 can be determined from this voltage difference. The measuring contacts 12 are, in one embodiment, configured as press-fit pins, which offers advantages in manufacturing, for example with regard to accuracy.

The connection regions 11a have edge-side extensions in the direction of the busbar center, which extend as projections 21 or lugs into the taper. The projections 21, which extend toward each other from opposite connection regions, are separated from each other by a gap at the edge of the busbar 11, so that the electrical current flows exclusively through the resistance region 11b. Fasteners, e.g. in the form of pins 15 (not shown, cf. FIGS. 2a, 2b), for example, press-fit pins, can be provided which allow the busbar 11 to be fastened to other components and/or to be fastened e.g. to a printed circuit board 2, 20 (cf. FIGS. 3b, 4) on the busbar 11, and optionally to electrically contact it. The pins 15 can be of the same design as the measuring contacts 12.

In the region of each of the two measuring contacts 12, the busbar 11 shown in FIG. 3a has a measuring point plateau 5 in which the measuring contact 12 is arranged. On two opposite sides of each measuring point plateau 5 there is situated in each case a recess 4, which partially surrounds the measuring point plateau 5 in an arcuate shape. The recesses 4 can have a curvature of a circular section at least partially on their side facing the respective measuring point plateau 5. Here, in one embodiment, the recesses 4 of a measuring contact 12 are arranged essentially symmetrically relative to the recesses 4 of the other measuring contact in relation to the transverse center axis QA, so that the measurement point plateaus 5 are also symmetrical to one another in relation to the transverse center axis QA.

Each of the recesses 4 extends transversely, for example, perpendicular to the longitudinal center axis LA, and can itself be formed essentially symmetrically in relation to the longitudinal center axis LA. The recesses 4 can each have a width between two and ten millimeters in the direction of the longitudinal center axis. The two recesses 4, which are arranged in the region of a measuring contact 12, can be formed essentially symmetrically to the measuring contact 12, for example, essentially point-symmetrically relative to the measuring contact 12 and/or essentially axially symmetrically with respect to an axis running through the measuring contact 12.

The measurement point plateaus are essentially free of current through the recesses 4, because the current flows around the recesses 4 and does not reach the measurement point plateaus 5. The measuring point plateaus 5 are then only connected via, in each case, two connecting crosspieces 9 to the current-carrying region of the resistance region 11b. The connecting crosspieces 9 can run transversely, for example, perpendicularly to the longitudinal center axis LA, so that the current flowing essentially parallel to the longitudinal center axis LA does not penetrate into the connecting crosspieces 9, or does so only to a very small extent. Via the connecting crosspieces 9, the relevant measuring point plateau 5 is at a potential which corresponds to the potential at the interfaces of the connecting crosspieces 9 with the current-carrying region of the resistance region 11b, so that the voltage difference between the measuring contacts 12 essentially corresponds to the voltage difference between these interfaces.

In one embodiment, the connecting crosspieces 9 can have a width, i.e. an extension in the direction of the longitudinal center axis LA, between two and five millimeters. The measuring point plateaus 5 can have a longitudinal extension, i.e. an extension in the direction of the longitudinal center axis LA and/or transverse center axis QA, of between five and twelve millimeters. The busbar 11 shown in FIG. 3a thus has dimensions and minimum sizes of structures (recesses 4 and remaining crosspieces) of e.g. 3 mm, so that it can be produced in a low-cost stamping process.

The temperature sensor 3 can be placed centrally in the resistance region 11b and centrally between the measuring contacts 12, so that the temperature is measured in precisely that region in the center of the voltage drop between measuring contacts 12. As a result, temperature-induced changes in the resistance of the material of the busbar 11 in the resistance region 11b of the busbar 11 can be optimally compensated in the context of a determination of the current flowing through the busbar 11. Not only at the measuring contacts 12 but also at the temperature sensor 3, the mean values of the corresponding voltages or temperatures from the respectively adjacent oppositely situated current-carrying areas of the busbar 11 are available. A non-uniform current or temperature distribution in the opposite current-carrying regions of the busbar 11 thus does not lead to falsification of the measurements.

In an embodiment (not shown), two temperature sensors can be placed in the current-carrying regions of the busbar. This is particularly useful if the mutually facing recesses 4 merge into one another and form a common recess 4a, so that no material remains along the longitudinal center axis LA between the measurement point plateaus (cf. FIG. 1c). The two temperature sensors would, for example, be arranged on the transverse center axis and essentially symmetrically about the longitudinal center axis, i.e., in the current-carrying regions lateral to the recesses 4. This can improve the response behavior of current measurement in the event of abrupt changes in the current intensity to be measured, because measurements are then made directly at the point where the heat is generated, namely in the effectively current-carrying areas of the resistance region.

FIG. 3b shows an apparatus for determining current 10 with the busbar 11 of FIG. 3a and a printed circuit board 2. The printed circuit board 2 can lie on the busbar and, for example, can be fastened on the busbar 11 by pins 15 (cf. FIGS. 2a, 2b), for example, on the projections 21, where the pins 15 can be of the same design as the measuring contacts 12.

The printed circuit board 2 can lie on the surface of the resistance region 11b largely without any separating distance. Conductor paths in the printed circuit board 2, which connect the measuring contacts 12 as measuring lines 6a, 6b, 7a, 7b to an evaluation circuit 18 (not shown) for determining the voltage dropping between the measuring contacts 12, thus also lie close to the surface of the resistance region 11b, and conductor loops during voltage measurement are largely prevented. The geometry of the arrangement of the measuring lines 7a, 7b on the printed circuit board 2 can be largely independent of the busbar geometry and current-shadow geometry, but it is advantageous if the measuring lines 7a, 7b extend over the remaining material of the resistance region 11b, and not via recesses 4. A printed circuit board 2, as shown in FIG. 3b, can therefore also be used in conjunction with other busbars 11, for example, from FIGS. 1a, 1b, 1c, 2a, 2b. The arrangement of the measuring lines 7a, 7b can be adapted accordingly.

The measuring lines 7a, 7b are thus installed as conductor paths within the printed circuit board 2 in such a way that frequency-dependent phase measurement errors are reduced. The measuring lines 7a, 7b for connecting the measuring contacts 12 to an evaluation circuit 18 (not shown) can be installed as conductor paths within a printed circuit board 2 along a path on the surface of the busbar 11 in such a way that the phase error is greatly reduced compared to a less optimized installation of the measuring lines 7a, 7b. In the example of the apparatus 10 shown in FIG. 3b, the measuring lines 7a, 7b start from the measuring contacts 12, span a measurement line region 8 in the shape of a polygon, and are brought together at a common tapping point 6 via measuring tapping lines 6a, 6b. A suitable evaluation unit 18 (not shown) can acquire the potentials of the two measuring contacts 12 at the tapping point 6. The measuring lines 7a, 7b can run in part essentially symmetrically in relation to the longitudinal center axis and/or to the transverse center axis of the resistance region.

The measurement line region 8 can span a polygon, e.g. a hexagon, wherein the polygon can have axes of symmetry which run along the transverse center axis and/or the longitudinal center axis. The width of the polygon can be approximately 70-100% or 70-85% of the width of the resistance region. In addition, the sides of the polygon can be formed by a plurality of conductor paths running in parallel.

In one embodiment of the apparatus 10, it is possible to arrange the temperature sensor 3 and the evaluation circuit 18 (not shown) on the side of the printed circuit board 2 opposite the busbar 11.

Figure 4:
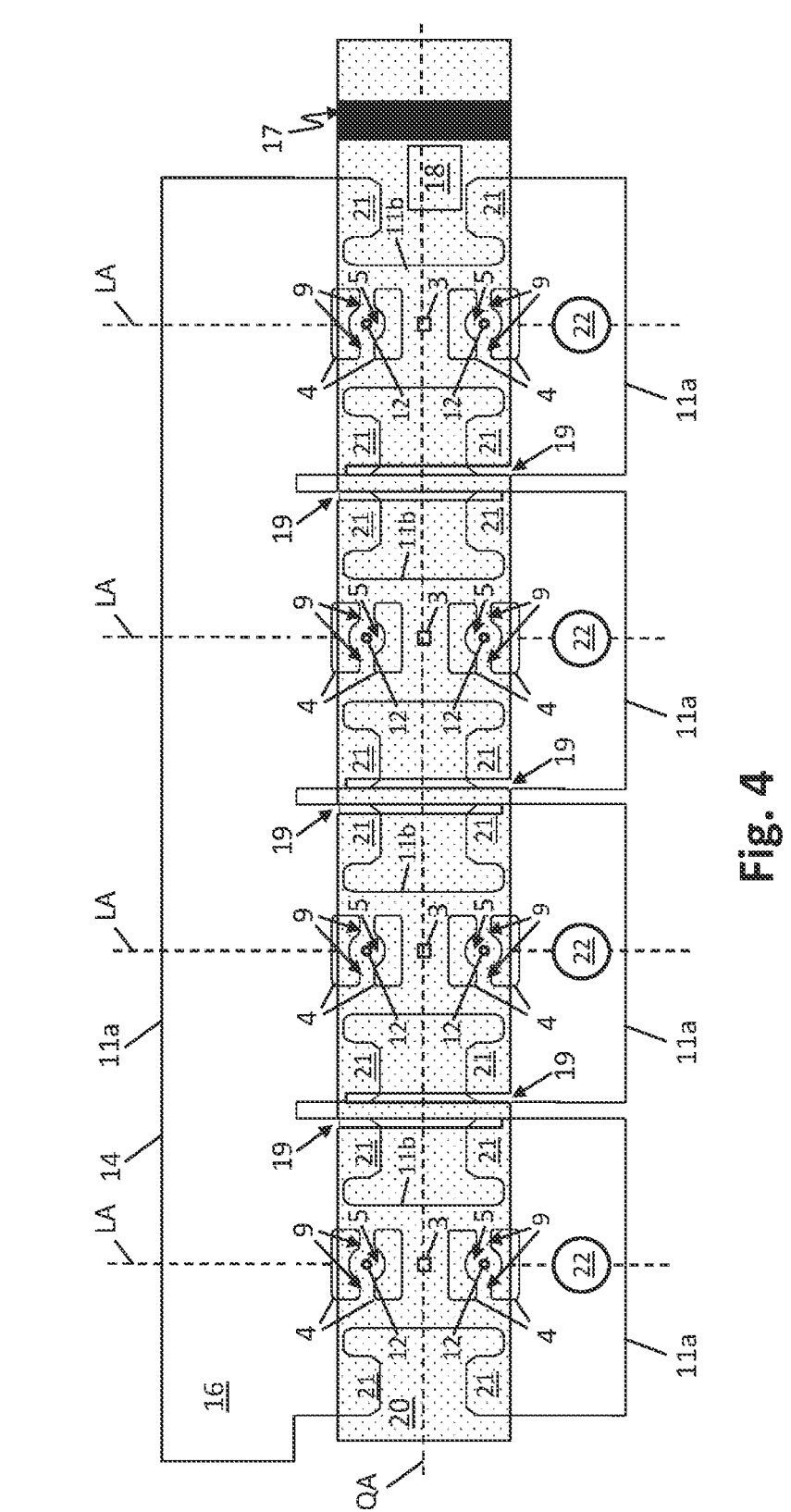
FIG. 4 schematically shows an embodiment of a multi-channel apparatus for determining current, and FIGS. 5a, 5b, 5c schematically show an embodiment of a printed circuit board of an apparatus for determining current.

FIG. 4 shows a multi-channel apparatus for determining current 13 having a multi-channel busbar 14 on which a printed circuit board 20 is arranged.

The multi-channel busbar 14 has, on a first side, four individual connection regions 11a with connection elements 22 for connecting a plurality of current-carrying lines. On a second side opposite the connection elements 22, the multi-channel busbar 14 has a common busbar 16 as a common connection region 11a for a common current-carrying line. The individual connection regions 11a are each assigned a resistance region 11b which is arranged between the respective individual connection region 11a and the common busbar 16. Here the multi-channel busbar 14 has a parallel circuit of identical or differently dimensioned resistance regions 11b in which basically different currents flow, which currents are measured via the respective voltage drop between the measuring contacts 12 of the respective resistance regions 11b. The resistance regions 11b have an optimized current-shadow geometries described above. The multi-channel busbar 14 has on one side first connection regions 11a which are electrically separated from one another and respective resistance regions 11b, which are electrically and mechanically connected to one another on the other side of the multi-channel busbar, so that a common second connection region forms in the form of a common busbar 16.

In the example shown, the geometry of the respective resistance regions 11b corresponds to the geometry of the busbar 11 in FIG. 3a. The resistance region 11b has one or more temperature sensors 3 corresponding to the busbar 11 in FIG. 3a, and the measuring contacts 12 are located on measuring point plateaus 5 corresponding to the busbar 11 in FIG. 3a, which are connected to current-carrying regions of the resistance region 11b by connecting crosspieces 9. The arrangement and shape of the recesses 4 can also correspond to that of FIG. 3a; the transverse center axis QA and the longitudinal central axes LA are depicted correspondingly in FIG. 4. It is also possible to construct a multi-channel busbar from individual busbar geometries, corresponding, e.g., to the busbars 11 in FIGS. 1a, 1b, 1c, 2a, 2b.

The printed circuit board 20 for measured value acquisition lies plane-parallel on the busbar 14, wherein the printed circuit board 20 covers a plurality of resistance regions 11b and is connected to the measuring contacts 12 of a plurality of resistance regions 11b. Measuring lines are arranged in the printed circuit board 20 and can be formed in a manner analogous to that shown in FIG. 3a, and, for example, are routed as conductor paths in the printed circuit board 20. The measurement values are transmitted from the measuring contacts 12 to the evaluation circuit 18 via the measuring lines. Various components can be dispensed with by using a common printed circuit board 20 for multi-channel busbars 14, since they only have to be realized singly instead of multiply, e.g., galvanic isolation 17, power supplies, evaluation circuit 18, analog-to-digital converters, communication drivers, wiring, and the like.

An arrangement of the printed circuit board 20 on the multi-channel busbar 14 that is as flush with the surface as possible is desirable, for the reasons already mentioned. During operation of a busbar 14 in a power converter, deformations of the multichannel busbar 14, for example, of individual resistance regions 11b with respect to each other, and/or of the printed circuit board 20 may occur, for example, due to thermal and electromechanical effects acting on the multichannel busbar 14 at high operating currents. Such deformations can lead to an at least partial lifting of the printed circuit board 20 away from the multi-channel busbar 14. This lifting of the printed circuit board 20 away from the surface of the multi-channel busbar 14 can be compensated by slots 19 in the printed circuit board 20, which are each arranged between the resistance regions 11*b* and extend parallel to the longitudinal center line LA from one edge of the printed circuit board 20 over at least half of the length of the printed circuit board 20. The slots 19 enable a slight "twisting" relative to one another of the sections of the printed circuit board 20 assigned to the individual resistance regions 11*b*. As a result, the printed circuit board 20 can follow on a sectional basis any deformations of the individual resistance regions 11*b* or connection regions 11*a* relative to one another, thus reducing mechanical stresses on the apparatus 13.

Figures 5A, 5B, 5C:
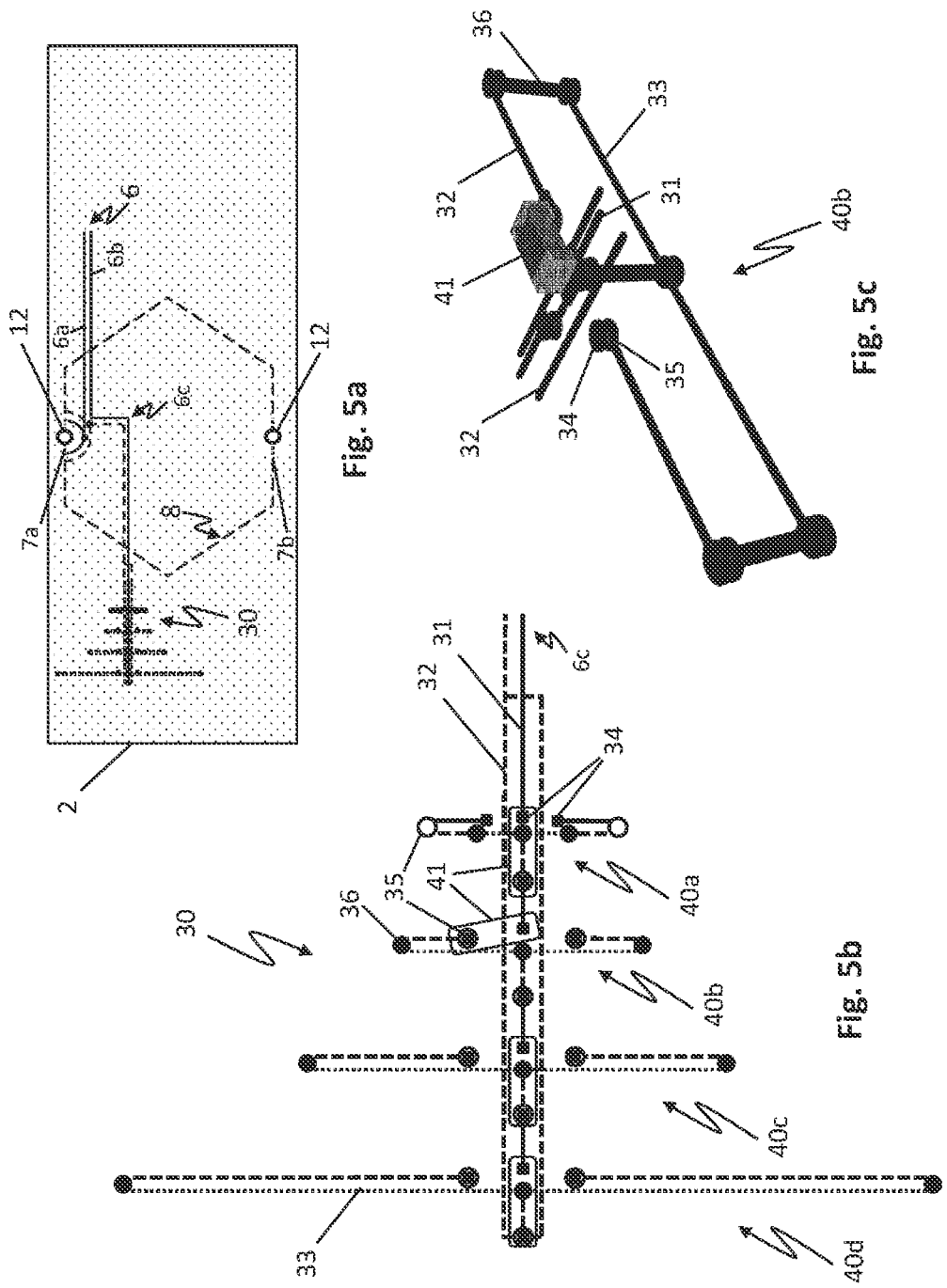

FIGS. 5*a*-5*c* show an embodiment of a printed circuit board of an apparatus for determining current, in different views. FIG. 5*a* shows a printed circuit board 2, which can be arranged, analogously to FIG. 3*b*, on a busbar 11 (not shown here) and captures the voltage dropping across the resistance region 11*b* of the busbar 11 by means of the measuring contacts 12. For this purpose, the printed circuit board 2 has the measuring lines 7*a*, 7*b*, which span a measurement line region 8 and connect the measuring contacts 12 to the measuring tapping lines 6*a*, 6*b* and to the tapping point 6. In addition, the printed circuit board 2 has a compensation structure 30 which is, in one embodiment, arranged in the resistance region of the busbar 11 and is electrically connected in series with the measuring line 7*b* via a further measuring tapping line 6*c*.

A compensation structure 30 with a specific configuration is shown enlarged in FIG. 5*b*. Here the solid lines represent conductor paths 31 in a first layer (layer #1) of the printed circuit board 2, while the dashed lines represent conductor paths 32 and the dotted lines represent conductor paths 33 in a second layer (layer #2) or a third layer (layer #3) of the printed circuit board 2. The layers #1, #2, and #3 are located in different planes of the printed circuit board 2. The compensation structure 30 comprises a plurality of compensation paths 40*a*, 40*b*, 40*c*, 40*d*, which are arranged parallel to one another and, when the printed circuit board 2 is arranged on a busbar 11, are parallel to the longitudinal axis of the busbar 11. The compensation paths 40*a*, 40*b*, 40*c*, 40*d* each have two oppositely oriented compensation arms which are explained in more detail below in conjunction with FIG. 5*c*.

In the example specific configuration according to FIG. 5*b*, only one compensation arm of the second compensation path 40*b* is connected to the measurement line 7*b*. Starting from the measuring tapping line 6*c*, the circuit described below results as an extension of the measuring line 7*b*. The conductor path 31 in layer #1, following the horizontal center axis of the compensation structure 33, initially ends at a soldering point 34 associated with the compensation path 40*a*. By means of an electrical connector, here, for example, by means of a bridge 41, this soldering point 34 is connected to a further soldering point 34 on the center axis, so that the compensation path 40*a* is bridged, i.e. the compensation path 40*a* is unused in this example. In its further course, the conductor path 31 reaches the next soldering point 34, which is associated with the compensation path 40*b*. By means of a further bridge 41, the conductor path 31 is connected to a soldering point 34 which is associated with the upper compensation arm of the compensation path 40*b* and coincides with a via 35 between layer #1 and layer #2, so that the conductor path 31 is connected via the bridge 41 and the via 35 to a conductor path 32 in layer #2. At the outer end point of the compensation arm, the conductor path 32 is connected via a via 36 between layer #2 and layer #3 to a conductor path 33 in layer #3 of the printed circuit board 2, and the conductor path 33 leads back to a via

36 at the center axis of the compensation structure 30. From there, a conductor path 32 in layer #2, a via 35, and a conductor path 31 leads to a soldering point 34 which is associated with the compensation path 40*c*. In this example, the compensation paths 40*c* and 40*d* are not used either and are bypassed by means of a bridge 41 in each case. Finally, a conductor path 32 on both sides of the center axis of the compensation structure leads back to the measuring tapping line 6*c* and is merged there.

It will be understood that the number of four compensation paths 40*a*-40*d*, as well as their respective length and sequence, is to be understood only as an example. Compensation structures 30 having any number of further compensation paths are conceivable, wherein each compensation path can either be used by connecting one of the respective compensation arms to the measurement line 7*b*, or can be bridged and thus not used.

FIG. 5*c* shows a detailed view of the compensation path 40*b* from FIG. 5*b*. The conductor path 31, which according to FIG. 5*b* is ultimately connected to the measuring tapping line 6*c*, is connected by the bridge 41 to a conductor path 32 which belongs to one of the two compensation arms of the compensation path 40*b*. This compensation arm is formed by the respective section of the conductor path 32 in layer #2, a via 36 between layer #2 and layer #3, a section of the conductor path 33 in layer #3, and a further via 36, so that the compensation arm forms an almost closed conductor loop which is oriented perpendicular to the surface of the printed circuit board (and thus perpendicular to the busbar 11) and parallel to the longitudinal center axis LA of the busbar. Due to the lack of a correspondingly placed bridge, the other compensation arm of the compensation path 40*b* is not connected to the measuring line 7*b* and is thus unused.

As an alternative to the upper compensation arm of the compensation path 40*b*, if required the lower compensation arm of the compensation path 40*b* can be connected to the measuring line 7*b* by a correspondingly placed bridge 41, or the compensation path 40*b* is not used and is bridged by a correspondingly placed bridge 41. In addition, individual or a plurality of the compensation arms of the other compensation paths 40*a*, 40*c* and/or 40*d* can be connected to the measuring line by means of suitably placed bridges 41. It is to be noted that the compensation arms, oriented in opposite directions, of a compensation path cause a compensation effect of the same magnitude but with a different sign.

In one embodiment, the compensation paths 40*a*-40*d* span surfaces with different cross-sectional areas. For this purpose, both the length of the arms, i.e. the width of the respective spanned surface, and the distance of the oppositely situated conductor paths, i.e. the height of the spanned area, can be suitably selected. Furthermore, a compensation arm can consist of a plurality of loops, by which the spanned surface is correspondingly multiplied.

In specific embodiments, the compensation arms are at least one millimeter and at most 20 millimeters long. The distance between the conductor paths of a compensation arm in the different planes of the printed circuit board is limited by the thickness of the printed circuit board and the number of planes in the printed circuit board and is between about 0.2 millimeters and about 10 mm.

As a result of the differently large spanned surfaces of the compensation paths 40*a*-40*d*, a number of combination options result, with different compensation effects in each case. In the specific example according to FIG. 5*b*, a total of 15 different combinations can be produced by using the upper compensation arms, a further 15 different combinations of the lower compensation arms, and some mixed forms using lower and upper compensation arms, which then have different compensation effects with different amplitudes and possibly signs when the spanned surfaces increase by powers of two.

In a specific application of the printed circuit board 2 according to FIG. 5*a* in an apparatus 10, for example, according to FIG. 3*b*, it can be determined by means of a calibration measurement which effects influence the measurement result in a specific embodiment, and with which magnitude. For this purpose, for example, the busbar 11 can be acted upon with a defined current and the voltage signal detected at the tapping point 6 can be evaluated, while all compensation paths 40*a*-40*b* are bridged and the compensation structure is to that extent inactive. Depending on the detected falsification of the measured values, which can include, for example, a non-linearity of the voltage signal in relation to the current in the busbar 11, it is decided whether, and if appropriate which, compensation arms of the compensation paths 40*a*-40*d* are to be connected to the measuring line 7*b* in order to minimize the undesired influences of the current to be measured on the measuring lines 7*a*, 7*b* and thus on the measurement result. As a result, a configuration of the compensation structure is defined which permanently ensures an optimal compensation of the undesired influences and, for example, minimizes frequency-dependent phase and amplitude measurement errors. In the case of a multi-channel busbar 14 according to FIG. 4, this configuration can be defined individually for the measurements on the individual channels in order to optimize the measurements on the individual channels individually.

What is claimed is:

1. A busbar comprising connection regions and at least one resistance region arranged between the connection regions for measuring a direct and/or alternating current with current intensities greater than 100 amperes, and comprising two measuring contacts which are arranged in the resistance region, wherein the measuring contacts are arranged on respective measuring point plateaus which are connected to a current-carrying region of the resistance region via respective connecting cross pieces that run transversely to a longitudinal center axis of the busbar, wherein recesses are arranged on both sides of the measuring point plateaus along the longitudinal center axis such that the measuring point plateaus are currentless during operation of the busbar, wherein the busbar is formed in one piece and made of a single material.

2. The busbar according to claim 1, wherein the resistance region is formed by a taper of a cross-section thereof relative to a cross-section of the connection regions of the busbar, wherein the taper is formed by a reduction in a width of the resistance region to a value between 10 and 60 percent of the width of the connection regions of the busbar.

3. The busbar according to claim 1, wherein the longitudinal center axis (LA) runs through the resistance region in a longitudinal direction of the busbar from one of the connection regions to an opposite connection region, wherein the measuring contacts are arranged in a region of the longitudinal center axis (LA), and wherein the busbar is symmetrical in relation to the longitudinal center axis (LA) at least between relevant connection regions.

4. The busbar according to claim 1, wherein the busbar, at least between the connection regions, is symmetrical in relation to a respective transverse center axis (QA) which runs centrally between respective connection regions in a transverse direction of the busbar, and wherein the measuring contacts are arranged symmetrically in relation to the transverse center axis (QA).

5. The busbar according to claim 1, wherein at least one temperature sensor is arranged between the measuring contacts, in a region of a longitudinal center axis (LA) and/or a transverse center axis (QA).

6. The busbar according to claim 1, wherein the longitudinal center axis (LA) forms an axis of symmetry of one or more of the recesses and/or at least two of the recesses are arranged symmetrically in relation to the transverse center axis (QA).

7. The busbar according to claim 1, wherein the recesses are formed symmetrically in relation to the respective measuring contact along the longitudinal center axis (LA) and/or the transverse center axis (QA).

8. The busbar according to claim 1, wherein the connecting crosspieces have a width between two and five millimeters, and wherein the measurement point plateaus have a longitudinal extension between five and twelve millimeters.

9. The busbar according to claim 1, wherein the recesses arranged on both sides of the measuring point plateaus are intersected centrally by the longitudinal center axis (LA) and have a width of between two and ten millimeters in a direction of the longitudinal center axis (LA).

10. The busbar according to claim 1, wherein a material thickness of the resistance region and/or of the connection regions is between two and six millimeters.

11. The busbar according to claim 1, wherein the busbar is made of copper or aluminum and/or wherein at least the recesses have been punched out.

12. The busbar according to claim 1, wherein the measuring contacts are configured as press-fit pins which are pressed into press-fit holes in the busbar.

13. An apparatus for determining current having a multi-channel busbar according to claim 1 and a printed circuit board arranged in a plane-parallel manner with respect to the busbar for measured value acquisition, wherein the measured value acquisition comprises an acquisition of a voltage difference between the two measuring contacts arranged in the resistance region and a temperature acquisition via at least one temperature sensor of the respective resistance region.

14. A power converter comprising current-carrying lines for conducting the direct and/or alternating currents processed by the power converter, wherein the power converter comprises a multi-channel apparatus for determining current having a multi-channel busbar comprising on a first side, at least two individual connection regions for connecting a plurality of the current-carrying lines and, on a second side, a common busbar as a common connection region, wherein resistance regions are arranged between the respective individual connection region and the common busbar for measuring direct and/or alternating currents with current intensities greater than 100 amperes, further comprising two measuring contacts arranged in each respective resistance region, wherein the multi-channel busbar has a geometry in which regions of the measuring contacts are currentless during operation of the power converter, the multi-channel apparatus further comprising a printed circuit board arranged in a plane-parallel manner with respect to the busbar for measured value acquisition, wherein the measured value acquisition comprises an acquisition of a voltage difference between the two measuring contacts of a respective resistance region, wherein the multi-channel apparatus bridges respective interruptions of the current-carrying lines, wherein the power converter is designed to determine, using the voltage differences detected by means of the measuring contacts along the respective resistance regions of the busbar, currents flowing through the current-carrying lines during operation of the power converter, wherein the power converter is configured to have a nominal power that is greater than 10 kW.

15. The power converter according to claim 14, wherein a printed circuit board for measurement values acquisition is arranged in a plane-parallel manner with respect to the busbar, wherein the printed circuit board covers a plurality of resistance regions and is connected to the measuring contacts of a plurality of resistance regions.

16. The power converter according to claim 15, wherein the printed circuit board comprises an evaluation circuit configured to preprocess measured voltages and temperatures of individual ones or the resistance regions, as well as a galvanic isolation, wherein the evaluation circuit is connected to a control circuit of the power converter via the galvanic isolation.

17. The power converter according to claim 14, wherein the printed circuit board has slots arranged between the resistance regions and extending parallel to the longitudinal center axis (LA) from an edge of the printed circuit board over at least half of a length of the printed circuit board.

\* \* \* \* \*